(12) United States Patent
Takashima

(10) Patent No.: US 6,710,386 B2
(45) Date of Patent: Mar. 23, 2004

(54) SEMICONDUCTOR MEMORY DEVICE USING FERROELECTRIC FILM

(75) Inventor: Daisaburo Takashima, Yokohama (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 10/456,563

(22) Filed: Jun. 9, 2003

(65) Prior Publication Data

US 2003/0209725 A1 Nov. 13, 2003

Related U.S. Application Data

(62) Division of application No. 09/948,877, filed on Sep. 10, 2001.

(30) Foreign Application Priority Data

Sep. 13, 2000 (JP) .......................................... 2000-277822

(51) Int. Cl.[7] ............................................. H01L 31/062
(52) U.S. Cl. ........................................ 257/295; 257/758
(58) Field of Search .................................. 257/295, 758

(56) References Cited

U.S. PATENT DOCUMENTS

| 5,903,492 A | 5/1999 | Takashima ................ 365/145 |
| 6,060,350 A | * 5/2000 | Iwasa ..................... 438/239 |
| 6,094,370 A | 7/2000 | Takashima ................ 365/145 |

FOREIGN PATENT DOCUMENTS

| JP | 09-008252 | 1/1997 |
| JP | 10-173147 | 6/1998 |

OTHER PUBLICATIONS

Korean Office Action (With Translation).

* cited by examiner

Primary Examiner—David Nelms
Assistant Examiner—Tu-Tu Ho
(74) Attorney, Agent, or Firm—Banner & Witcoff, Ltd.

(57) ABSTRACT

Each memory cell has a cell transistor and a ferroelectric capacitor connected in parallel between a source and drain terminals of this cell transistor. The ferroelectric capacitor has a bottom electrode and a top electrode and a contact connects the top electrode and one of a source and drain terminals of the cell transistor. This contact is arranged at the position offset from the interval of the bottom electrodes.

6 Claims, 16 Drawing Sheets

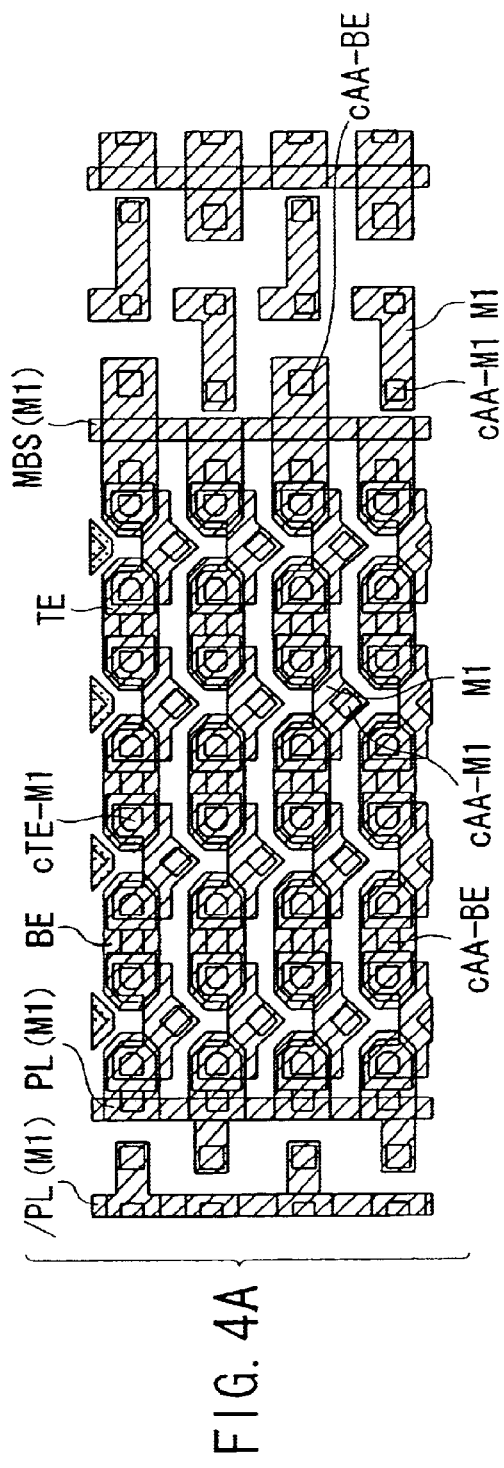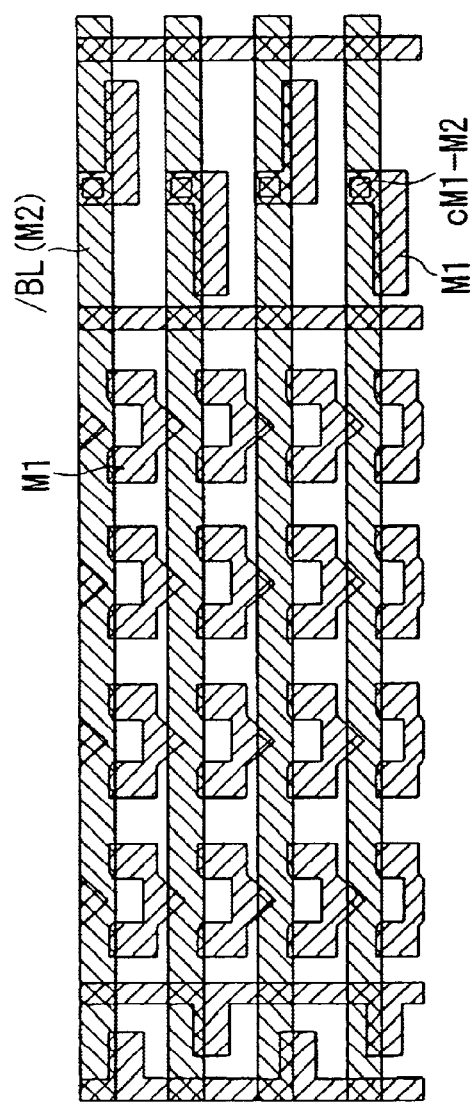
FIG. 4A
FIG. 4B

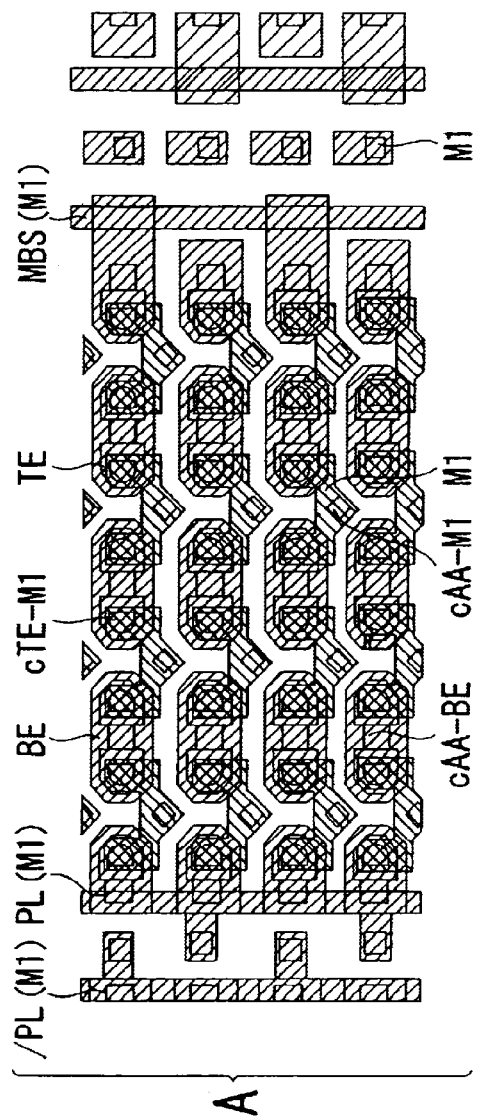
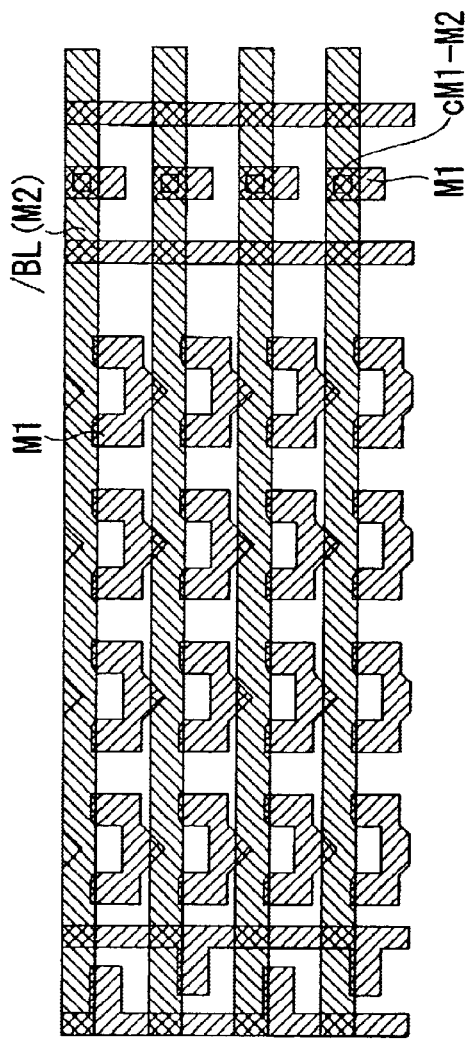
F I G. 6A
F I G. 6B

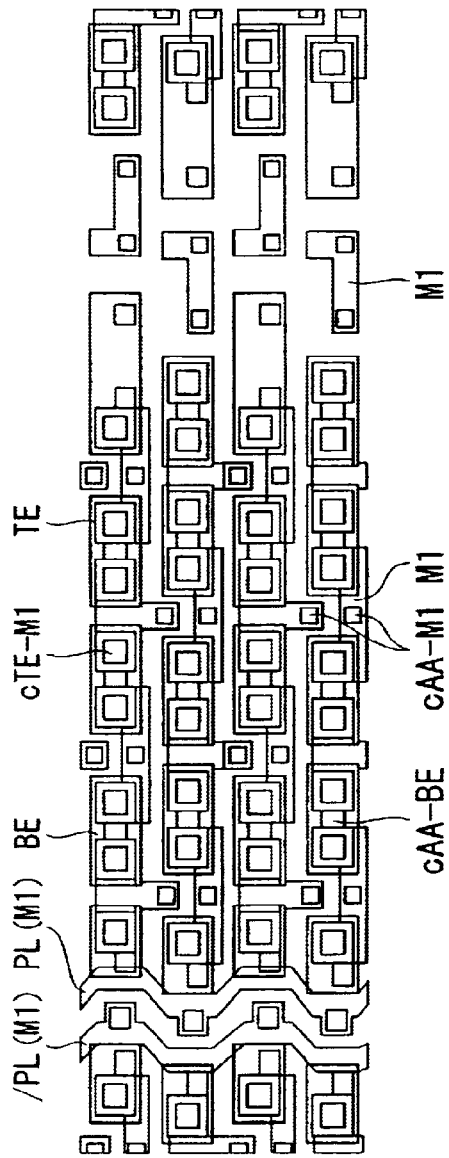
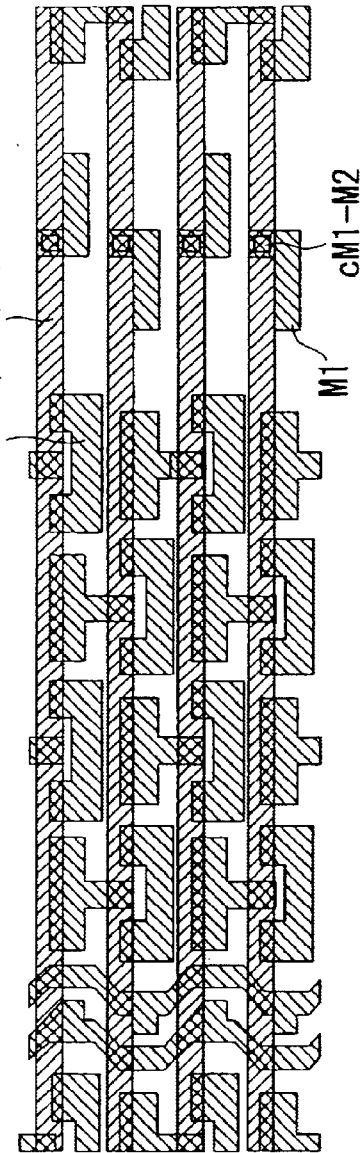
FIG. 9A
FIG. 9B

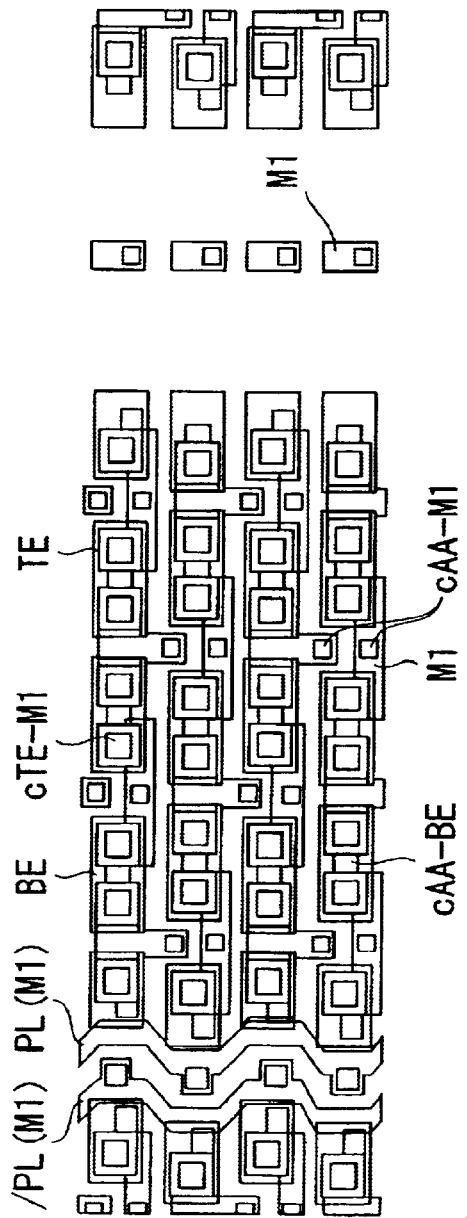
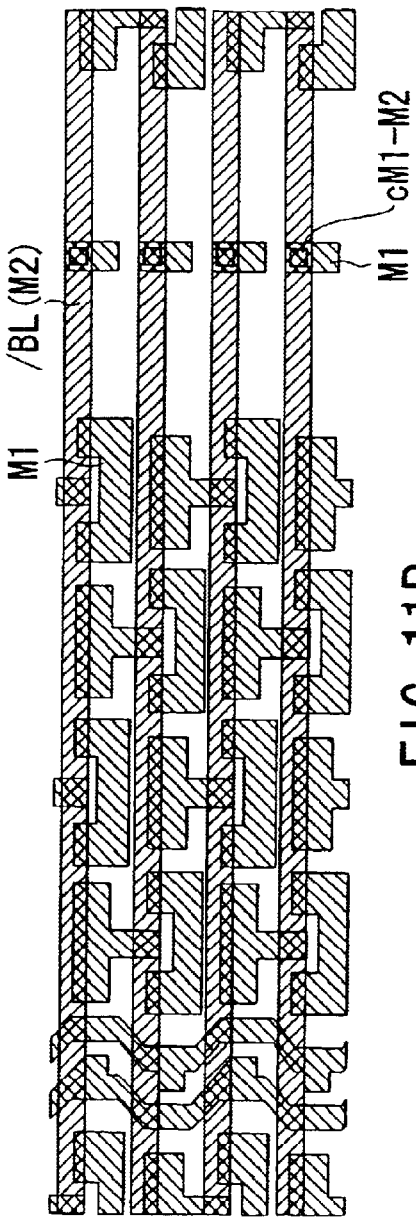
FIG. 11A
FIG. 11B

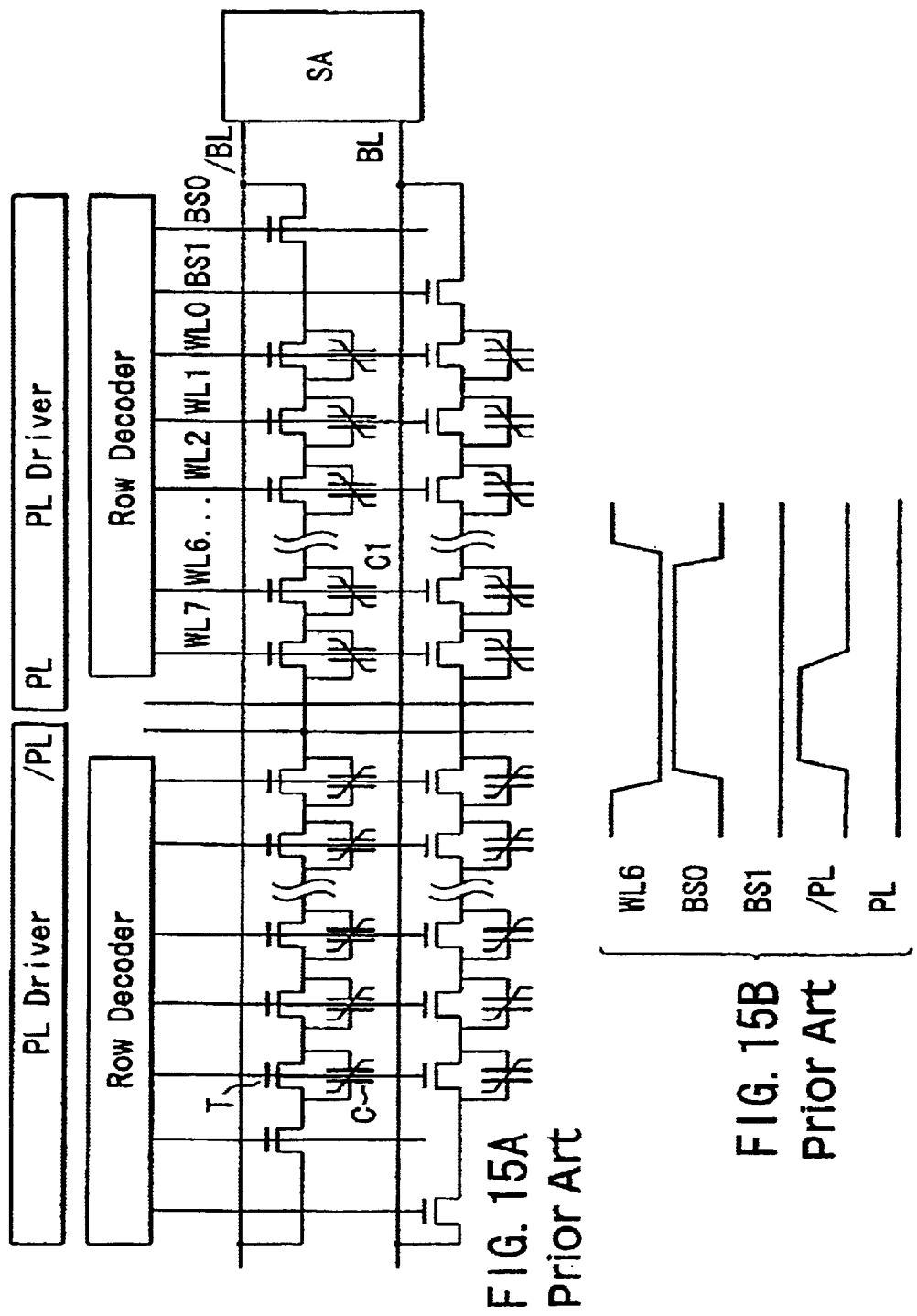

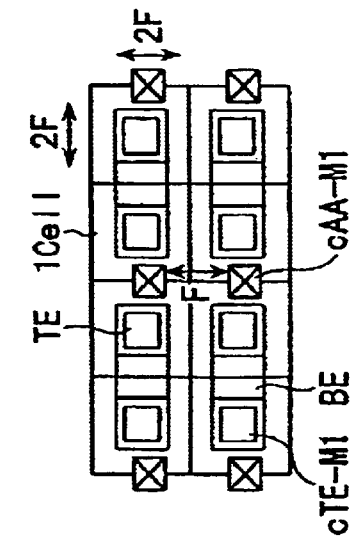
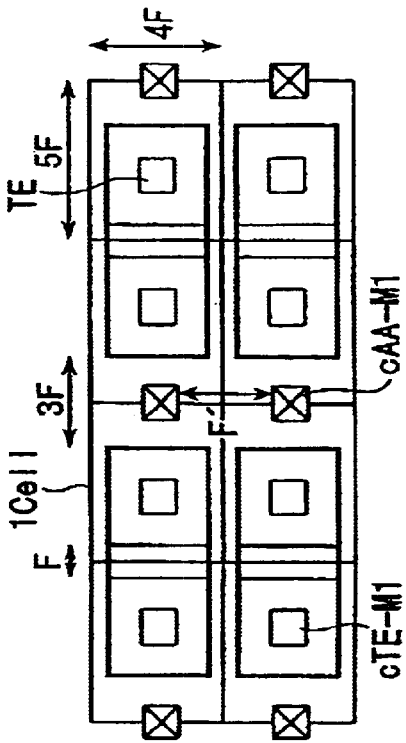
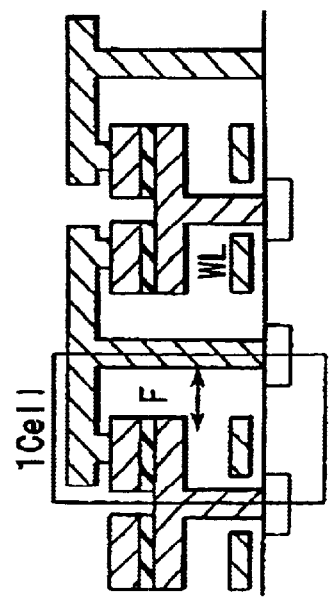
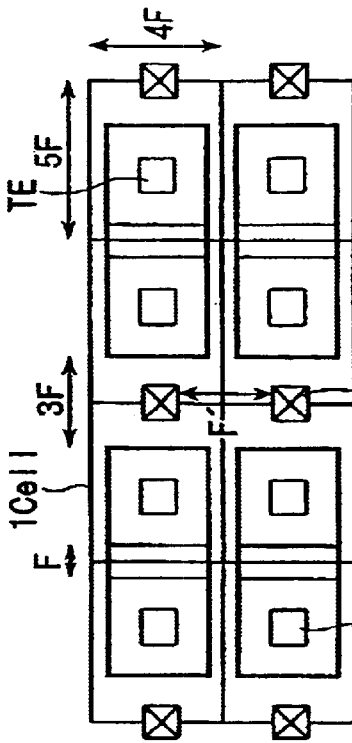
FIG. 16A Prior Art
FIG. 16B Prior Art
FIG. 16C Prior Art
FIG. 16D Prior Art

SEMICONDUCTOR MEMORY DEVICE USING FERROELECTRIC FILM

CROSS-REFERENCE TO RELATED APPLICATIONS

This application is a Divisional of U.S. application Ser. No. 09/948,877 filed on Sep. 10, 2001, hereby incorporated by reference as to its entirety. This application is based upon and claims the benefit of priority from the prior Japanese Patent Application No. 2000-277822, filed Sep. 13, 2000, the entire contents of which are incorporated herein by reference.

BACKGROUND OF THE INVENTION

1. Field of the Invention

The present invention relates to a semiconductor memory device using a ferroelectric film, and particularly relates to a semiconductor memory device having a highly integrated memory cell.

2. Description of the Related Art

Nowadays, a semiconductor memory is utilized in many electronic devices such as a main memory in a large-sized computer, a personal computer, home electric products, a portable telephone and the like. As kinds of semiconductors, a volatile DRAM (Dynamic RAM), a SRAM (Static RAM), a nonvolatile MROM (Mask ROM), a flash EEPROM and the like are listed.

Particularly, although DRAM is a volatile memory, DRAM is excellent in that DRAM is manufactured at low cost, the area of a cell of a DRAM is small in size as ¼ of that of a SRAM, and a high-speed operation is capable in DRAM compared with a flash EEPROM. Therefore, DRAM occupies almost all share of the market.

A rewritable nonvolatile flash EEPROM has an advantage in a point that data of the rewritable nonvolatile flash EEPROM is not erased even if the electric source is turned off. However, in the case of this flash EEPROM, the number of times of rewriting (number of times of Write/Erase) achieves only on the order of $10^6$. Besides this, there are several defaults that it takes longer, i.e., a few micro seconds to write when compared with that of a DRAM, and further, it requires a high voltage (12V to 22V) to write. Therefore, the scale of the market of flash EEPROM is not large compared with that of DRAM.

In contrast, a nonvolatile ferroelectric memory using a ferroelectric capacitor has been proposed in 1980. This ferroelectric memory is nonvolatile, besides that, this type of ferroelectric memory has advantages that the number of times of rewriting achieves as many as on the order of $10^{12}$, a speed of the read/write time is a high speed on the order of the speed of a DRAM and further it can be operated at 3V to 5V. Therefore, in the future, there will be a possibility that all of the memory is replaced by this ferroelectric memory, and every manufacturer carries out the development of it.

FIG. 14A shows a general ferroelectric memory, a configuration of a memory cell consisting of one transistor and one capacitor, and a cell array. A memory cell configuring a ferroelectric memory is constituted of a cell transistor 100 and a ferroelectric capacitor 101. These are connected in series. A cell array is constituted of bit lines BL, /BL for reading out data, word line WL0, WL1 for selecting a cell transistor, plate line PL0, PL1 for driving one end of the ferroelectric capacitor 101.

However, the ferroelectric memory as shown in FIG. 14B is a folded bit line configuration in which one memory cell 102 is arranged at two intersections of a word line and a bit line. Therefore, suppose that each wiring width and a space between wirings is F, the minimum cell size is calculated by the formula of $2F \times 4F = 8F^2$. Moreover, FIG. 14C shows a sectional structure of a cell array corresponding to that in FIG. 14B.

Thus, as for a ferroelectric memory, there has been a problem that its cell size is limited to $8F^2$ and the size is large the same as that of DRAM.

Moreover, as to a ferroelectric memory, it is necessary to divide a plate line for each word line and to be individually driven. This is because it prevents the destruction of electronic polarization information of a ferroelectric capacitor configuring non-select cell. Furthermore, a plurality of ferroelectric capacitors is connected to an individual plate line of a ferroelectric memory in a direction of the word line. Therefore, the load capacity of a plate line is large. In addition, it is necessary to arrange a plate line drive circuit at a pitch equal to a pitch of the word line. Therefore, it is difficult to enlarge the area for arranging a plate line drive circuit, and the size of the plate line drive circuit cannot be enlarged. Therefore, as shown in FIG. 14D, a delay time at the time when the potential of a plate line is raised and lowered is on the order of 30 to 100 ns, and this delay time is longer than the delay time at the time when the potential of a word line is raised and lowered. As a result, there has been a problem that the operation is delayed.

In order to solve the problem, the inventor has proposed a new ferroelectric memory which can satisfy and be compatible with three points of (1) a small, $4F^2$-sized memory cell, (2) a flat transistor which is easily manufactured, and (3) a high-speed random access function having general versatility in U.S. Pat. Nos. 5,903,492 and 6,151,242 (the contents of which are incorporated herein by reference in their entirety).

FIG. 15A shows a configuration of a ferroelectric memory described in the related patent of the present invention described above. In FIG. 15A, a unit cell is constituted of a cell transistor (T) and a ferroelectric capacitor (C). The both ends of ferroelectric capacitor (C) are connected between the source and drain of the cell transistor (T), respectively. A plurality of unit cells are connected in series and configured into a memory cell block.

One end of each memory cell block is connected to bit lines BL, and /BL via a block selection transistor, the other end is connected to plate lines PL and /PL.

With this configuration, a memory cell of the minimum size of $4F^2$ can be realized by using a flat transistor. At the time of standby, all the word lines WL0 to WL7 are made to be "H" level, and the memory cell transistor is turned on. Furthermore, block selection signals BS0, BS1 are made to be "L" level, and the memory transistor is turned off. By doing so, both ends of a ferroelectric capacitor are electrically short-circuited by the cell transistor being turned on. Therefore, the potential difference is not occurred between both ends of the ferroelectric capacitor, and the memory polarization is stably maintained.

At the time of being active, only cell transistors connected in parallel to a ferroelectric capacitor from which data should be read out is turned off, and a block selection transistor is turned on. For example, in the case where the ferroelectric capacitor C1 is selected, as shown in FIG. 15B, the word line WL6 is made to be "L") level.

Subsequently, the plate line /PL at the capacitor C1 side is made to be "H", the block selection signal BS0 at the capacitor C1 side is made to be "H" level. By doing so, the potential difference between plate line /PL and bit line /BL is applied only to both ends of the ferroelectric capacitors C1 which are connected in series to the memory cell transistor being in an OFF state. Therefore, the polarization information of the ferroelectric capacitor C1 is read out to the bit line /BL.

Therefore, by connecting unit cells in series and selecting an arbitrary word line, cell information of an arbitrary ferroelectric capacitor can be read out, and a complete random access can be realized. Moreover, since the plate line can be shared with a plurality of unit cells, the arrangement region of a plate line can be reduced so that the size of a chip can be reduced. Therefore, there is no limitation that the pitch of the plate line drive circuit must be equal to the pitch of the word line. Therefore, the area of a plate line drive circuit (PL Driver) can be increased and a high-speed operation can be realized by increasing the drive capacity.

FIG. 16A shows a sectional view of a part of a memory cell shown in FIG. 15A, and shows an example of an ideal structure. A ferroelectric capacitor having a bottom electrode BE, a ferroelectric film FE, and a top electrode TE is arranged directly above the memory cell transistor in which a word line WL serves as a gate. With such a configuration, as shown in FIG. 16B, a memory cell can be arranged at each one intersection of a word line and a bit line.

As shown in FIG. 16A, the top electrode (TE) is connected to a cell wiring M1, the cell wiring M1 is connected to source and drain terminals AA via a contact cAA-M1. At this time, if the path between the contact cAA-M1 and the ferroelectric capacitor is formed in a self-alignment manner, and the ferroelectric capacitor is configured at the minimum size of F×F=F$^2$, the minimum memory cell having a size of 4F$^2$ can be realized. In this case, since the contact cAA-M1 is formed in a self-alignment manner with respect to the ferroelectric capacitor, a space F between wirings is not required.

A semiconductor memory device shown in FIGS. 16A and 16B has the following subjects.

First, it is technically difficult that the contact cAA-M1 described above is formed in a self-alignment manner with respect to the ferroelectric capacitor. Therefore, as a result, as shown in FIG. 16C, the necessity is generated that the distance between the contact cAA-M1 and the ferroelectric capacitor is kept on the order of the length F which is defined in the minimum design rule.

Moreover, in order to form a stopper made of SiN or the like for the self alignment, it is required to be treated at a high temperature. However, after a ferroelectric capacitor is formed, in the case where a stopper made of SiN or the like is formed at a high temperature treatment, the performance of the ferroelectric capacitor is deteriorated. Therefore, it is difficult to treat at a high temperature, and it has been technically difficult to form a contact cAA-M1 in a self-alignment manner with respect to the ferroelectric capacitor.

Second, it is difficult to form a ferroelectric capacitor having a size of F$^2$ described above. This is because: (a) it is easily damaged when the ferroelectric capacitor is formed when the size of a ferroelectric capacitor is reduced. As a result, the polarization capacity of the ferroelectric capacitor is deteriorated; (b) the ferroelectric capacitor uses Pt, Ir, Sr, Ru and the like as an electrode material. It is difficult to reduce the size of the capacitor because it is difficult to process these materials.

FIG. 16D shows a plan view of a memory cell in the case where the distance between the contact cAA-M1 and the ferroelectric capacitor is long, and the area of the ferroelectric capacitor is larger than F$^2$ (in this case, 3F×3F=9F$^2$). In the horizontal direction in FIG. 16D, the distance between the contact cAA-M1 and the ferroelectric capacitor is long. In addition, the size of the capacitor is enlarged also in the vertical direction in FIG. 16D. Therefore, the size of a cell is enlarged. In the horizontal direction in FIG. 16D, the distance between the contact cAA-M1 and the ferroelectric capacitor is the sum of the width F of the contact and the spaces F of the respective right and left side spaces of the contact. Therefore, this distance is represented by 3F.

At this time, the distance F' between both of contacts cAA-M1 adjacent to each other in the vertical direction also becomes longer when compared with the minimum distance F of FIG. 16B. Therefore, a dead space of the interval between both contacts is produced. As a result, the size of the cell is further enlarged. In this example, F'=3F is established, and a dead space exists with a large area of 2F×3F=6F$^2$ in FIG. 16D as compared with that in FIG. 16B.

Thus, the size of the ferroelectric capacitor of the ferroelectric memory becomes larger than the ideal size, in the case where the distance between the capacitor and the contact is apart, there has been a problem that a dead space is produced at the interval between the contacts and the size of the cell becomes still large.

BRIEF SUMMARY OF THE INVENTION

According to an aspect of the present invention, there is provided a semiconductor memory device comprising: a first and second memory cells which are adjacently arranged, the first and second memory cells each having a cell transistor and a ferroelectric capacitor connected in parallel to the cell transistor, the ferroelectric capacitor having a bottom electrode, a top electrode and a ferroelectric film provided between these bottom and top electrodes, and the cell transistor having a source and drain terminals; a first contact provided between the bottom electrode of the ferroelectric capacitor and one side of the source and drain terminals of the cell transistor; a wiring having a first and second ends, the first end connected to the top electrode of the ferroelectric capacitor; and a second contact provided between the second end of the wiring and another side of the source and drain terminals of the cell transistor, the second contact being arranged at a position offset in the perpendicular direction with respect to the array direction of the memory cells located between the memory cells.

BRIEF DESCRIPTION OF THE SEVERAL VIEWS OF THE DRAWING

FIG. 4A is a plan view showing a layout of a part of a ferroelectric memory according to the second embodiment of the present invention, and FIG. 4B is a plan view showing a layout of a part of the ferroelectric memory according to the second embodiment of the present invention;

FIG. 6A is a plan view showing a layout of a part of a ferroelectric memory of the third embodiment of the present invention and FIG. 6B is a plan view showing a layout of a part of a ferroelectric memory of the third embodiment of the present invention;

FIG. 9A is a plan view showing a layout of a part of a ferroelectric memory according to the fifth embodiment of the present invention and FIG. 9B is a plan view showing a layout of a part of a ferroelectric memory according to the fifth embodiment of the present invention;

FIG. 11A is a plan view showing a layout of a part of a ferroelectric memory according to a seventh embodiment of the present invention and FIG. 11B is a plan view showing a layout of a part of a ferroelectric memory according to the seventh embodiment of the present invention;

FIG. 15A is an equivalent circuit showing a ferroelectric memory according to the related art of the present invention and FIG. 15B is a timing chart showing an operating timing of FIG. 15A; and FIG. 16A is a sectional view showing an ideal structure of a ferroelectric memory according to the related art of the present invention, FIG. 16B is a plan view of FIG. 16A, FIG. 16C is a sectional view showing an actual structure of a ferroelectric memory according to the patent related to the present invention and FIG. 16D is a plan view showing an actual structure of a ferroelectric memory according to the patent related to the present invention.

DETAILED DESCRIPTION OF THE INVENTION

Hereinafter, the embodiments of the present invention will be described with reference to the drawings.

(First Embodiment)

Figure 1A:
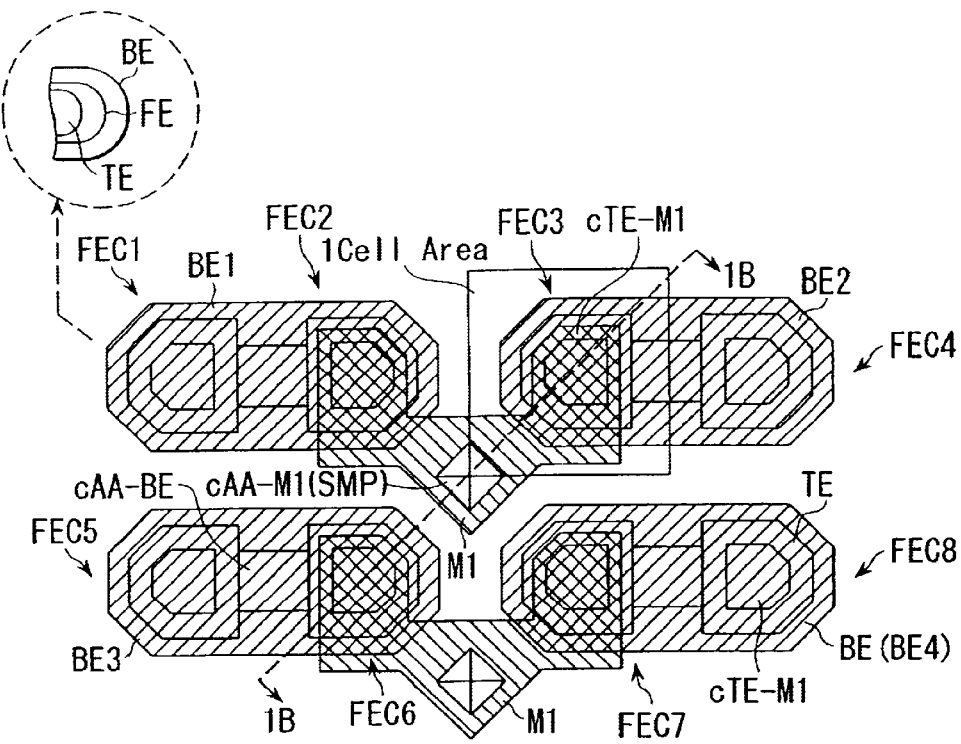
FIG. 1A shows a ferroelectric memory according to the first embodiment of the present invention and is a plan view of a memory cell and FIG. 1B is a sectional view taken along the line 1B—1B of FIG. 1A.
Figure 1B:
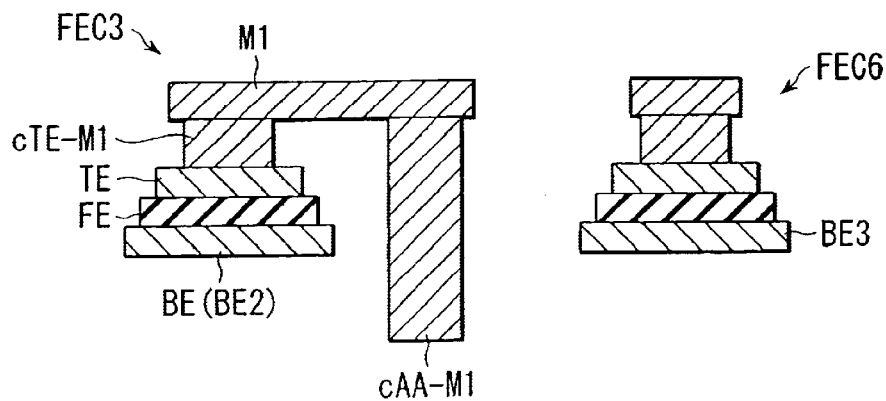

FIG. 1 shows the first embodiment of the present invention. The first embodiment can be applied to a semiconductor memory device of a circuit configuration shown in FIG. 15A, and the size of a memory cell can be reduced compared with the conventional one. The configuration of one memory cell is similar to the example shown in FIG. 15A, and is constituted of cell transistors connected in parallel and a ferroelectric capacitor. One memory block is constituted of a plurality of memory cells connected in series. One end of this memory cell block is connected to a bit line (not shown) via a block selection transistor, and the other end thereof is connected to a plate line (not shown). FIG. 1A shows a plan view of a memory cell which can realize a circuit configuration shown in FIG. 15A, and whose cell size can be reduced. Moreover, FIG. 1B shows a sectional view taken along the line 1B—1B of FIG. 1A.

In the respective drawings following FIGS. 1A and 1B, a ferroelectric film is denoted by FE, and a top electrode of a ferroelectric capacitor is denoted by TE. A bottom electrode of a ferroelectric capacitor is denoted by BE, and a metal wiring made of aluminum, copper or the like and a wiring made of another material is denoted by M1. A contact connecting the top electrode TE and the metal wiring M1 is denoted by cTE-M. A contact connecting between the metal wiring M1 and a source or drain electrode of memory cell transistor is denoted by cAA-M1, and a contact connecting between the bottom electrode BE and a source or drain electrode of a memory cell transistor is denoted by cAA-BE.

Specifically, the bottom electrode BE which is one end of a ferroelectric capacitor is connected to a source electrode of a cell transistor via a contact cAA-BE. The top electrode TE which is the other end of a ferroelectric memory is connected to a wiring M1 via a contact cTE-M1. The wiring M1 is connected to a drain electrode of a cell transistor via the contact cAA-M1. As a result, a parallel connection of the cell transistor and the ferroelectric capacitor can be realized and one memory cell can be configured.

The ferroelectric capacitor FE is provided between the top electrode TE and the bottom electrode BE and contacted with these electrodes. FIG. 1A shows total eight examples of the ferroelectric capacitors FEC1 to FEC8. In these examples, the bottom electrodes of two ferroelectric capacitors adjacent to each other in the horizontal direction are connected each other. Therefore, in FIG. 1A, four bottom electrodes BE1 to BE4 are arranged. In the drawing, two bottom electrodes BE1 and BE2 located on the upper side belong to the common memory block, two bottom electrodes BE3 and BE4 located on lower side belong to the memory cell block connected to the adjacent bit line.

The top electrodes TE2 and TE3 of two center ferroelectric capacitors FEC2 and FEC3 are connected to the wiring m1 via the contact cTE-M1, and the wiring M1 is shared with two center ferroelectric capacitors FEC2 and FEC3. Similarly, the contact cAA-M1 is also shared with two center ferroelectric capacitors FEC2 and FEC3.

Now, in a memory shown in FIG. 16D, a contact cAA-M1 is arranged in the middle of two ferroelectric capacitors adjacent to each memory cell block. Therefore, the useless space existed. However, in the present embodiment, the contact cAA-M1 is arranged in the middle of the adjacent four ferroelectric capacitors FEC2, FEC3, FEC6 and FEC7 of the adjacent memory cell block as shown in FIG. 1A. Specifically, the intervals between the contact cAA-M1 and four ferroelectric capacitors are set at the same distance, respectively. In other words, the contact cAA-M1 is arranged to be shifted from the center portion of two ferroelectric capacitors FEC2 and FEC3 to the side of the adjacent memory cell block by only half the cell pitch. In this way, the contact cAA-M1 is arranged at the position equally distanced from four top electrodes located on the periphery thereof.

Here, the corners of the top electrodes TE of four ferroelectric capacitors, the ferroelectric film FE and the bottom electrode BE are cut off, respectively. With such a configuration, a space is produced in the intervals between four ferroelectric capacitors. Therefore, a sufficient distance between the contact cAA-M1 and the bottom electrode BE (or the top electrode TE) can be maintained and an increase in the size of a cell can be also prevented by arranging the contact cAA-M1 in this space.

The crossing region enclosed by these four ferroelectric capacitors is naturally widened by lithography or precise processing, and an allowance is created between the contact cAA-M1 and the bottom electrode BE. The contact cAA-M1 is formed using a square mask pattern (SMP).

Furthermore, in FIG. 1A, the distance between the contact cAA-M1 and the bottom electrode BE is widened to the maximum by rotating the contact cAA-M1 at 45 degrees. The amount of cutting off the corner of the bottom electrode BE depends upon the distance between the contact cAA-M1 and the bottom electrode BE. Therefore, in order to increase this distance, the amount of cutting off may be increased.

The corner of the bottom electrode BE can be cut off when the etching is carried out by using a mask. At that time, the shape of the mask to be used may be the desired shape of the bottom electrode.

The corner of the top electrode TE can be cut off when the etching is carried out by using a mask. At that time, the shape of the mask to be used may be the desired shape of the top electrode.

Moreover, the corner of the ferroelectric film FE can be cut off when the etching is carried out by using a mask. At that time, the shape of the mask to be used may be the desired shape of the ferroelectrice film.

Moreover, the contact cAA-M1 is formed in the direction tilted at 45 degrees with respect to the direction in which a plurality of memory cells are connected in series. In order to form the contact cAA-M1 in such a shape, a mask for forming a contact cAA-M1 is formed in the direction tilted at 45 degrees with respect to the direction in which a plurality of memory cells are connected in series. The contact cAA-M1 of the desired shape can be formed by carrying out the etching by using this mask.

The distance between the center ferroelectric capacitors FEC2 and FEC3 and the distance between the ferroelectric capacitors FEC6 and FEC7 can be reduced to the minimum design rule by this layout of a cell. Therefore, the size of a cell can be reduced.

Moreover, a space between four adjacent bottom electrodes BE can be narrowed by cutting off the corners of the top electrode TE, the ferroelectric film FE and the bottom electrodes BE. The useless space can be eliminated and the size of a cell can be reduced by assigning this space to the forming region of the contact cAA-M1 and the space between the contact cAA-M1 and the bottom electrodes BE.

According to the first embodiment, a semiconductor memory device which can be easily manufactured, and which has a high speed random access function and is capable of being highly integrated can be realized. Furthermore, according to the first embodiment, the size of a memory cell can be reduced without reducing the design rule. Therefore, the area of a chip can be reduced. Moreover, the distance between the ferroelectric capacitors and the contact cAA-M1 can be precisely and finely maintained without using a self alignment technology. Therefore, a high integrated semiconductor memory device can be provided.

Furthermore, according to the first embodiment, in a ferroelectric memory having an equivalent circuit similar to the equivalent circuit shown in FIG. 15A, a contact cAA-TE from the top electrode TE to a source or drain electrode of the memory cell transistor is arranged at the center portion of the crossing region formed by the bottom electrodes BE of four ferroelectric capacitors. Therefore, the corners of four top electrodes TE are intentionally rounded or automatically rounded by the lithography and processing steps, thereby creating a space corresponding to the crossing region. Therefore, the increase of the size of a cell can be prevented while the distance between the contact cAA-TE and the top electrodes TE is maintained.

Moreover, since the shape of the contact cAA-TE is a square rotated at 45 degrees with respect to the direction of alignment of memory cells, the distance between the contact cAA-TE and the top electrodes TE can be reduced.

Furthermore, in a memory cell structure having an equivalent circuit similar to the equivalent circuit shown in FIG. 15A, the contact cAA-TE is provided at the center of the crossing region formed by four top electrodes TE. Specifically, a space is formed for arranging the contact cAA-TE among four top electrodes TE by forming four top electrodes TE into a polygon having the number of sides equal to or more than that of a pentagon as shown in dotted circle of FIG. 1A. Therefore, the increase of the size of a cell can be prevented as well as the distance between the contact cAA-TE and the top electrodes TE can be maintained.

(Modification Example of the First Embodiment)

Figure 2A:
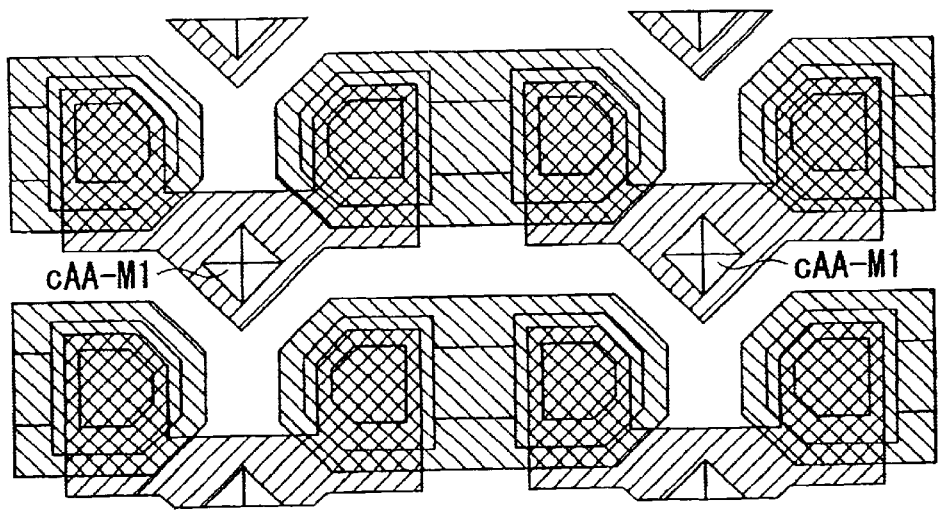
FIG. 2A shows a modification example of the first embodiment of the present invention and is a plan view of a memory cell and FIG. 2B is a plan view of a memory cell showing another modification example of the first embodiment of the present invention.
Figure 2B:
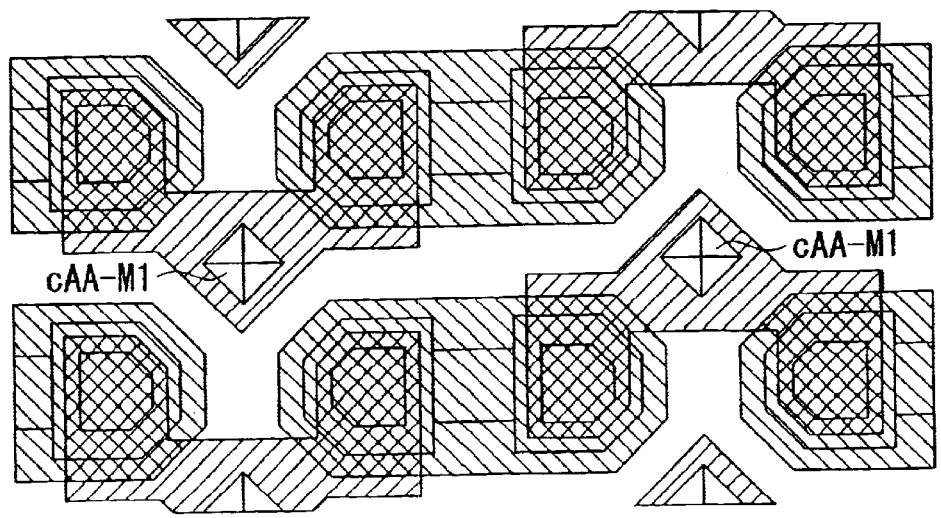

FIGS. 2A and 2B show the modification example of the first embodiment.

FIGS. 2A and 2B show only four memory cells in the horizontal direction and two cell blocks arranged in the vertical direction, and four memory cells per each cell block and the whole configuration is omitted. Moreover, the bit line is arranged along the longitudinal direction of each cell block, and arranged in the horizontal direction of FIGS. 2A and 2B, however, the bit line is not shown in FIGS. 2A and 2B.

In FIG. 2A, a plurality of memory cells are linearly arranged in series in a certain direction, thereby forming a cell block. The contact cAA-M1 within each cell block is arranged to be shifted from the position of the bottom electrodes BE or the top electrodes TE of the ferroelectric capacitors within the same cell block to the side of one of the bit line (not shown) which is arranged adjacent to the cell block. Specifically, the contact cAA-M1 belonging to each cell block is arranged only on one of the sides of the cell block.

In contrast, in FIG. 2B, the contact cAA-M1 within the same cell block is alternately arranged from the position of the bottom electrodes BE or the top electrodes TE of the ferroelectric capacitors within the same cell block to the side of both bit lines (not shown) which are arranged adjacent to the cell block. Specifically, the contact cAA-M1 belonging to each cell block is alternately arranged on both sides of the cell block.

According to these modification examples, an effect similar to that of the first embodiment shown in FIGS. 1A and 1B can be obtained.

(Second Embodiment)

FIGS. 3A, 3B and FIGS. 4A, 4B show the second embodiment of the present invention. FIGS. 3A, 3B and FIGS. 4A, 4B can be applied to a configuration similar to the equivalent circuit shown in FIG. 15A, and show a memory cell configuration whose memory cell size can be reduced compared to those of FIGS. 16A to D.

Figure 3A:
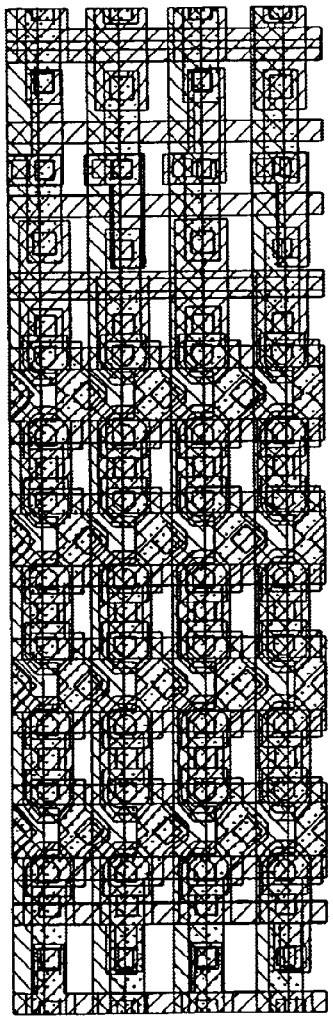
FIG. 3A is a plan view showing a layout of the whole ferroelectric memory according to a second embodiment of the present invention and FIG. 3B is a plan view showing a layout of a part of the ferroelectric memory according to the second embodiment of the present invention.
Figure 3B:
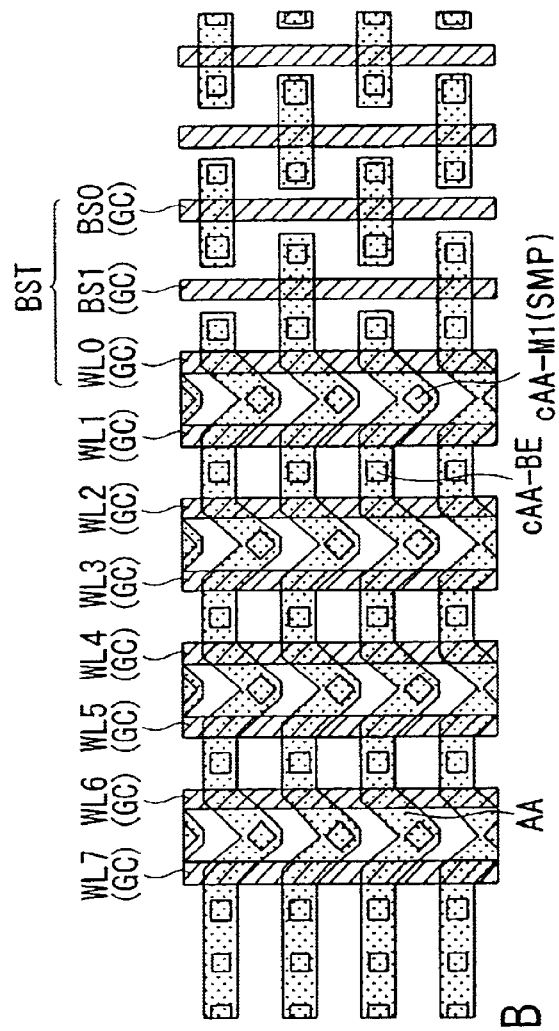

FIGS. 3A, 3B and FIGS. 4A, 4B show the whole configuration of a memory cell block using a memory cell of the type shown in FIG. 2A, the equivalent circuit of the memory cell block is similar to the equivalent circuit shown in FIG. 15A. FIG. 3A shows data of the whole layout of a cell block according to the second embodiment. FIGS. 3B, 4A and 4B show a part of the layout within FIG. 3A by dividing the layout into the several layers, respectively.

In FIGS. 3B, 4A, and 4B, a word line is indicated as WLi, a bit line is indicated as /BL. A main-block selecting signal is indicated as MBS. A block selecting signal is indicated as Bsi (i=0, 1). A plate line is indicated as /PL or PL.

FIG. 3B shows a diffusion layer AA (active area) of a source/drain electrode of a cell transistor, a contact cAA-M1 between the diffusion layer AA and the first metal wiring (M1), a contact cAA-BE between a bottom electrodes BE of the ferroelectric capacitors and the diffusion layer AA and a gate layer GC (gate conductor) of a transistor.

FIG. 4A shows the first metal wiring M1, the top electrodes TE of the ferroelectric capacitors, the bottom electrodes BE of the ferroelectric capacitors, the contact cTE-M1 between the top electrodes of the ferroelectric capacitors and the first metal wirings, the contact cAA-BE between the bottom electrodes of the ferroelectric capacitors and the diffusion layers and the contact cAA-M1 between the diffusion layer and the first metal wiring M1. It should be noted that the plate lines /PL, PL and the main block selection line MBS are also formed with the first metal wiring M1.

FIG. 4B shows the first metal wiring M1, the second metal wiring M2, the contact cM1-M2 between the first metal wiring and the second metal wiring. The bottom electrode BE as one end of the ferroelectric capacitor as similar to the first embodiment is connected to a source electrode of a cell transistor via the contact cAA-BE. The top electrode TE as the other end of the ferroelectric capacitor is connected to the first metal wiring Ml via the contact cTE-M1. The first metal wiring M1 is connected to a drain electrode of a cell transistor via the contact cAA-M1. As a result, a parallel connection of the cell transistor and the ferroelectric capacitor can be realized and one memory cell can be configured.

A cell block is formed by connecting eight memory cells in series, the right end of the cell block is connected to the bit line /BL via a block selection transistor BST, the left end of the cell block is connected to the plate lines /PL, PL. The two kinds of block selection transistors BST controlled by two block selection lines BS0 and BS1 is formed by configuring so as to stride over the field transistor by using the bottom electrode or the first metal wiring M1. The field transistor does not operate as a transistor, but operates as a wiring.

It should be noted that a main block selection (MBS) line is constituted of the first metal wiring M1, and is used when a hierarchical main block (MBS) line is formed, the main block selection line is used. The main block selection (MBS) line may be present or absent. In the case where a main block selection (MBS) line is present, a hierarchical main block selection (MBS) line can be realized without increasing a wiring layer and the size of a chip can be reduced.

In the second embodiment, the contact cAA-M1 is arranged as similar to the first embodiment at the same distance from four ferroelectric capacitors, specifically, arranged in the middle of four ferroelectric capacitors. Specifically, the contact cAA-M1 is arranged by being offset from the center portion of two ferroelectric capacitors to the lower side shown in the drawing by half the cell pitch.

Now, the corners of the top electrodes and the bottom electrodes of four ferroelectric capacitors are cut off. With such a configuration, a space is created among four ferroelectric capacitors and the contact cAA-M1 can be arranged in this space. Beside that, with this configuration, the sufficient distance between the contact cAA-M1 and the bottom electrodes BE (or top electrodes TE) can be maintained, and the increase of a cell can be prevented.

In the second embodiment, each word line and plate line is regularly and linearly arranged. Therefore, a circuit can be comparatively easily designed.

The effect similar to that of the first embodiment can be also obtained according to the second embodiment.

(Third Embodiment)

FIGS. 5A, 5B and FIGS. 6A, 6B show the third embodiment of the present invention. FIGS. 5A, 5B and FIGS. 6A, 6B can be applied to a configuration similar to the equivalent circuit shown in FIG. 15A, and show a memory cell configuration whose memory cell size can be reduced compared to those of FIGS. 16A to D.

Figure 5A:
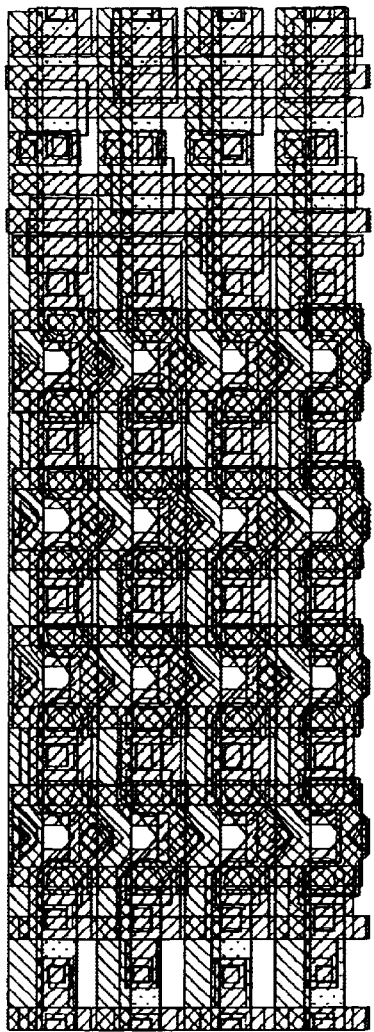
FIG. 5A is a plan view showing a layout of the whole ferroelectric memory according to a third embodiment of the present invention and FIG. 5B is a plan view showing a layout of a part of a ferroelectric memory according to the third embodiment of the present invention.
Figure 5B:
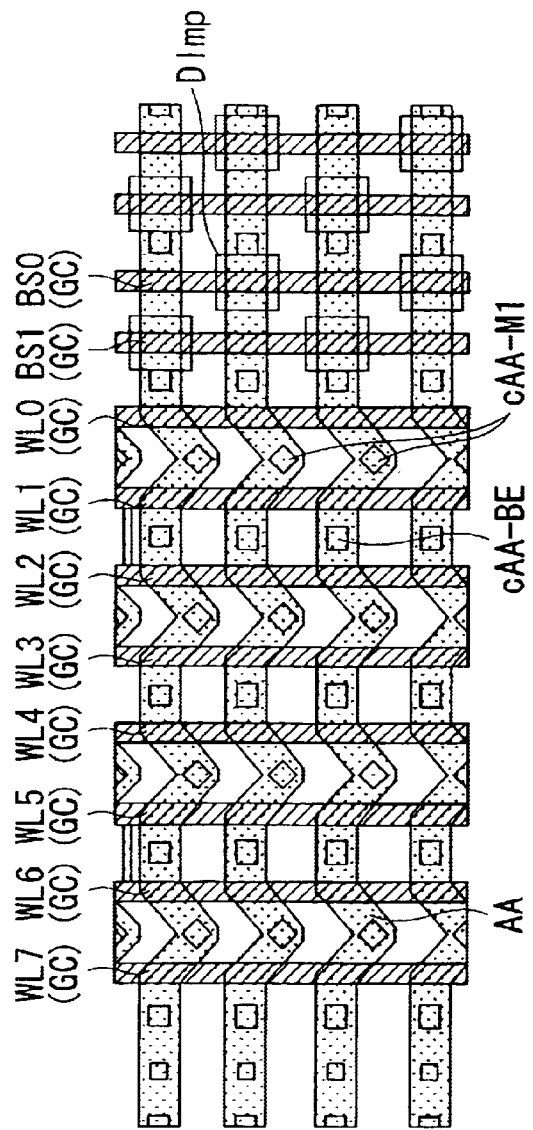

FIGS. 5A, 5B and FIGS. 6A, 6B show the whole configuration of a memory cell block using a memory cell of the type shown in FIG. 2A, the equivalent circuit of the memory cell block is similar to the equivalent circuit shown in FIG. 15A. FIG. 5A shows data of the whole of the layouts of a cell block according to the third embodiment. FIGS. 5B, 6A and 6B show a part of the layout within FIG. 5A by dividing the layout into the several layers, respectively. The layout configurations of FIGS. 5B, 6A and 6B are the approximately same as those of FIGS. 3B, 4A and 4B.

The third embodiment is different from the second embodiment in the following points: specifically, the third embodiment uses two kinds of block selection transistors BST. One of the block selection transistors is constituted of an enhancement type transistor whose threshold voltage is positive. The other block selection transistors is constituted of a depression type transistor whose threshold voltage is negative.

FIG. 5B shows a D-type implantation mask (DImp) for forming a depression type transistor. By employing a depression type transistor, the area of a block selection transistor can be reduced, and the distance between the cell blocks adjacent to each other in the longitudinal direction can be reduced. Therefore, the higher integration can be carried out compared to the second embodiment.

Furthermore, also according to the third embodiment, the effect similar to those of the first and second embodiments can be obtained.

(Fourth Embodiment)

Figure 7A:
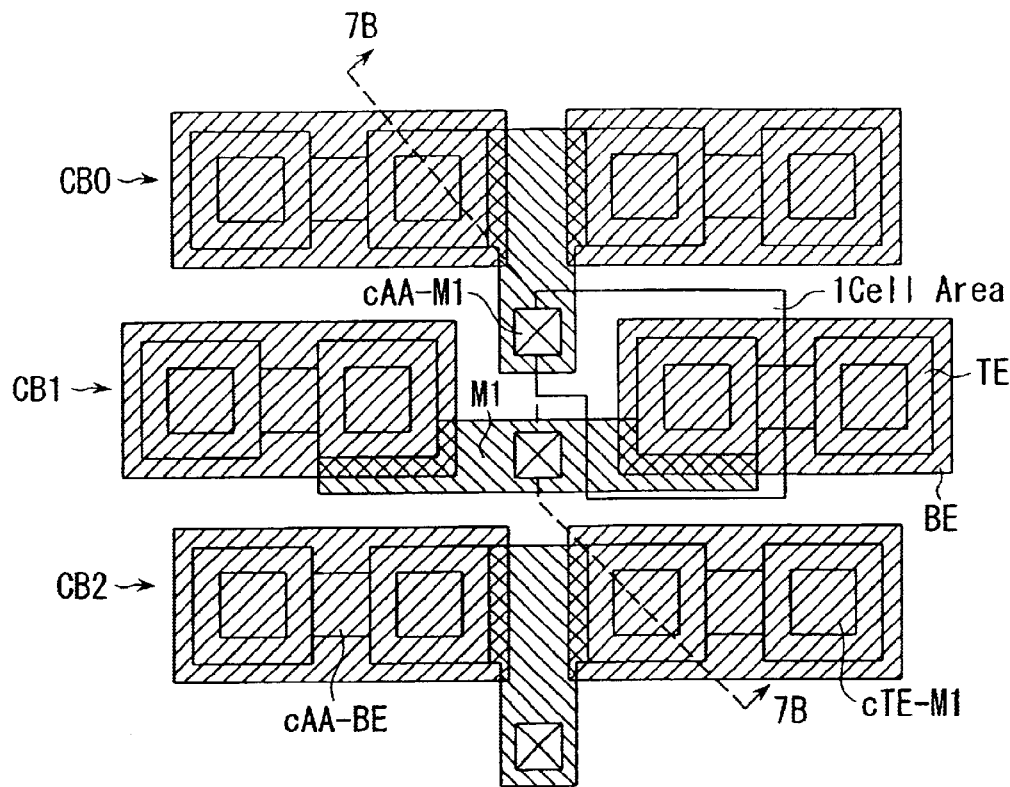
FIG. 7A is a plan view of a memory cell of a ferroelectric memory of a fourth embodiment of the present invention and FIG. 7B is a sectional view taken along the line 7B—7B of FIG. 7A.
Figure 7B:
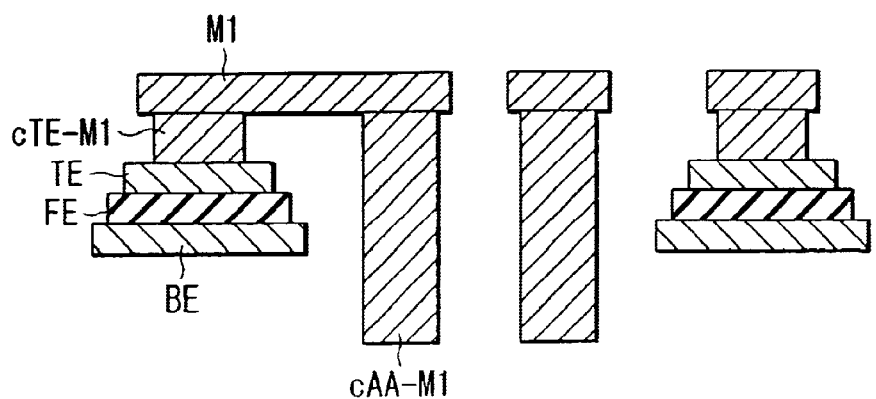

FIGS. 7A and 7B show fourth embodiment of the present invention.

FIG. 7A can be applied to a configuration similar to the equivalent circuit shown in FIG. 15A, shows a plan view of a memory cell whose memory cell size can be reduced compared to those of FIGS. 16A–D, and FIG. 7B shows an example of a section taken along the line 7B—7B of FIG. 7A.

In FIGS. 7A and 7B, a ferroelectric film is denoted by EF, and a top electrode of a ferroelectric capacitor is denoted by TE. A bottom electrode of a ferroelectric capacitor is denoted by BE, and a metal wiring is denoted by M1. The contact cTE-M1 connects the top electrode TE and the metal wiring M1. The contact cAA-M1 connects between the metal wiring M1 and a source or drain electrode of a memory cell transistor. The contact cAA-BE connects between the bottom electrode BE and a source or drain electrode of a memory cell transistor. As a result, a cell transistor and a ferroelectric capacitor are connected in parallel, and one memory cell can be configured.

The ferroelectric capacitor is configured so that the top electrode TE and the bottom electrode BE sandwich the ferroelectric film FE. FIG. 7A shows an example of total twelve ferroelectric capacitors. The bottom electrode BE of ferroelectric capacitor is shared with two adjacent ferroelectric capacitors. Therefore, in FIG. 7A, six bottom electrodes BE are arranged. In FIG. 7A, two bottom electrodes BE located on the uppermost portion belong to the cell block CB0, two bottom electrodes BE in the center and the lowest portions belong to the cell block CB1 and CB2, respectively, and the respective cell blocks CB0 to CB2 are connected to the adjacent bit lines.

In the respective cell blocks CB0 to CB2, the top electrodes TE of two ferroelectric capacitors located at the center portion are connected to the metal wiring M1 via the contact cTE-M1. The metal wiring M1 is shared with two ferroelectric capacitors within each cell block. The contact cAA-M1 connected to the metal wiring M1 is also similarly shared with two ferroelectric capacitors within each cell block.

Now, in the configuration shown in FIG. 16D, the respective bottom electrodes BE which are shared with two ferroelectric capacitors are arranged at equal intervals, and the contact cAA-M1 is arranged at the center portion of two ferroelectric capacitors within cell block. Therefore, the useless dead space has been produced.

In contrast, in fourth embodiment, the bottom electrodes BE which are shared with two ferroelectric capacitors within cell block are not arranged at equal interval, the interval between the bottom electrodes BE is widened per two bottom electrodes BE within cell block. Two contacts cAA-M1 are arranged on the portion of this wide interval. Out of two contacts cAA-M1, one is a contact cAA-M1 of the adjacent cell block. With such a configuration, the dead space can be reduced compared with the configuration of FIG. 16D and the size of a memory cell can be reduced.

In fourth embodiment, two cell blocks adjacent to each other on the plan view are made as one set, the distance between two bottom electrodes BE in one cell block is made as the minimum rule, and the distance between two bottom electrodes BE in the other cell block is widened and a space is formed. Furthermore, the contact cAA-M1 in one cell block is arranged in this space with the contact cAA-M1 within the other cell block.

According to this configuration, the size of the ferroelectric capacitor becomes larger than the minimum design rule F. Therefore, in the case where it is arranged in the space widened by the contact cAA-M1, the useless space is produced. However, one contact within the adjacent cell block is arranged in the space widened. Therefore, the creation of the useless space can be prevented and as a result, the size of a cell can be reduced.

As similar to the first embodiment, the corners of the top electrodes TE, the ferroelectric film FE and the bottom electrodes BE of four ferroelectric capacitors may be cut off, respectively. With such a configuration, a space is further created among four ferroelectric capacitors. Therefore, the distance between the contact cAA-M1 and the bottom electrodes BE, or the distance between the contact cAA-M1 and the top electrodes TE can be sufficiently maintained and the contact cAA-M1 can be arranged without increasing the size of a cell as well.

Moreover, the distance between the contact cAA-M1 and the bottom electrodes BE can be widened to the maximum by rotating the contact cAA-M1 at 45 degrees similarly to the first embodiment. The distance between the contact cAA-TE and the top electrodes TE can be minimized by rotating the contact cAA-TE at 45 degrees and making it square shape.

With such a configuration, the effect similar to that of the first embodiment can be also obtained according to fourth embodiment.

(Fifth Embodiment)

Figure 8A:
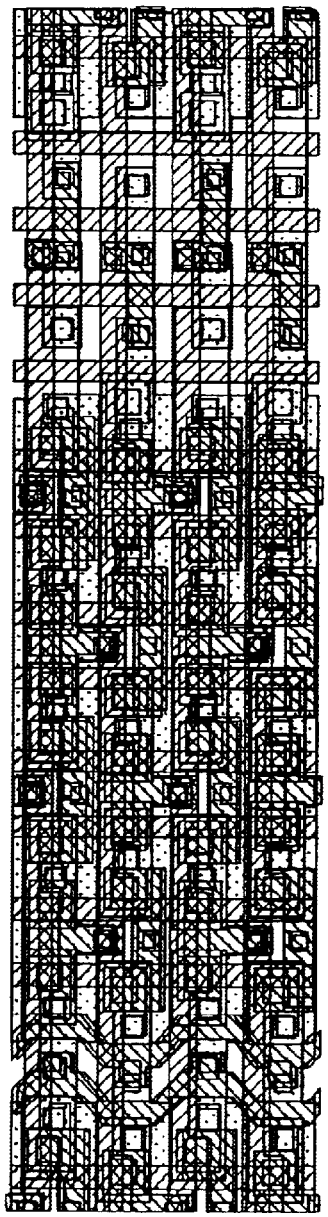
FIG. 8A is a plan view showing a layout of the whole ferroelectric memory according to a fifth embodiment of the present invention and FIG. 8B is a plan view showing a layout of a part of a ferroelectric memory according to the fifth embodiment of the present invention.
Figure 8B:
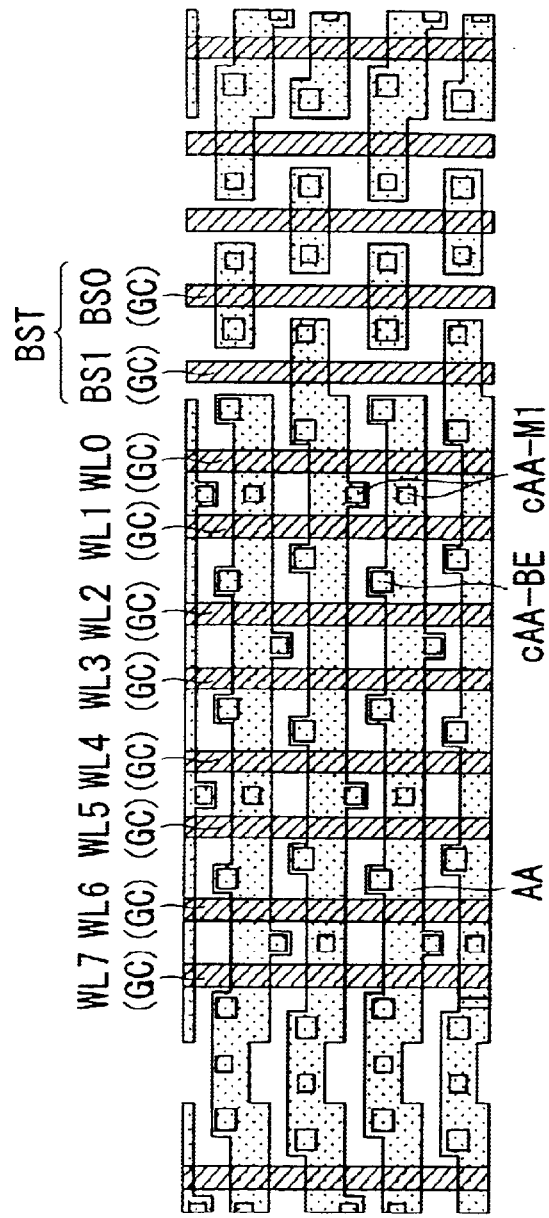

FIGS. 8A, 8B and FIGS. 9A, 9B show the fifth embodiment of the present invention. FIGS. 8A, 8B and FIGS. 9A, 9B show the whole configuration of a memory cell block using a memory cell of the type shown in FIG. 7A, the equivalent circuit of the memory cell block is similar to the equivalent circuit shown in FIG. 15A. FIG. 8A shows data of the whole layout of a cell block of the fifth embodiment. FIGS. 8B, 9A and 9B show a part of the layout within FIG. 8A by dividing the layout into the several layers, respectively.

In FIGS. 8B, 9A and 9B, same reference numerals are attached to same portions identical to those of FIGS. 3A, 3B and FIGS. 4A, 4B.

FIG. 8B shows a diffusion layer AA (active area) of a source electrode and a drain electrode of a cell transistor, a contact cAA-M1 between the diffusion layer AA and the first metal wiring M1, a contact cAA-BE between a bottom electrodes BE of the ferroelectric capacitors and the diffusion layer AA and a gate layer GC of a transistor.

FIG. 9A shows the first metal wiring M1, the top electrodes TE of the ferroelectric capacitors, the bottom electrodes BE of the ferroelectric capacitors, the contact cTE-M1 connecting the top electrodes TE of the ferroelectric capacitors and the first metal wirings M1, the contact cAA-BE connecting the bottom electrodes BE of the ferroelectric capacitors and the diffusion layers and the contact cAA-M1 contacting the diffusion layer and the first metal wiring M1.

FIG. 9B shows a contact cM1-M2 connecting the first metal wiring M1, the second metal wiring M2, the first metal wiring M1 and the second metal wiring M2.

By making it a configuration of FIGS. 8B, 9A and 9B, a cell transistor and a ferroelectric capacitor can be connected in parallel, and one memory cell can be configured. The cell block is formed by connecting eight memory cells in series, the right end of the cell block is connected to the bit line /BL via a block selection transistor BST, the left end of the cell block is connected to the plate lines /PL, PL. One of the two kinds of block selection transistors BST controlled by two lines of block selection lines BS0 and BS1 is formed by configuring so as to stride over the field transistor using the bottom electrode or the first metal wiring M1. Here, the configuration of a field transistor is similar to that of the second embodiment.

As described above, in the fifth embodiment, the respective bottom electrodes shared with two ferroelectric capacitors are not arranged at equal intervals as in the first embodiment. Specifically, within each cell block, the interval for two bottom electrodes BE is widened and a wide space is formed. The total contacts cAA-TE of one contact cAA-TE of the cell block and one contact cAA-TE of the adjacent cell block are arranged in this widened space.

According to the fifth embodiment, in a wide space formed per two bottom electrodes BE, the total two contacts cAA-TE of one contact cAA-TE of the cell block and one contact cAA-TE of the adjacent cell block are arranged. Therefore, the increase of a dead space can be prevented and the size of a memory cell can be reduced.

Moreover, in FIG. 9A, every other cell block projects its end portion in the horizontal direction in the drawing.

Therefore, the plate lines PL, /PL are not linearly arranged in the vertical direction in the drawing, but it may be arranged in a snaking shape.

The effect similar to that of the first embodiment can be also obtained by the fifth embodiment.

(Sixth Embodiment)

Figure 10A:
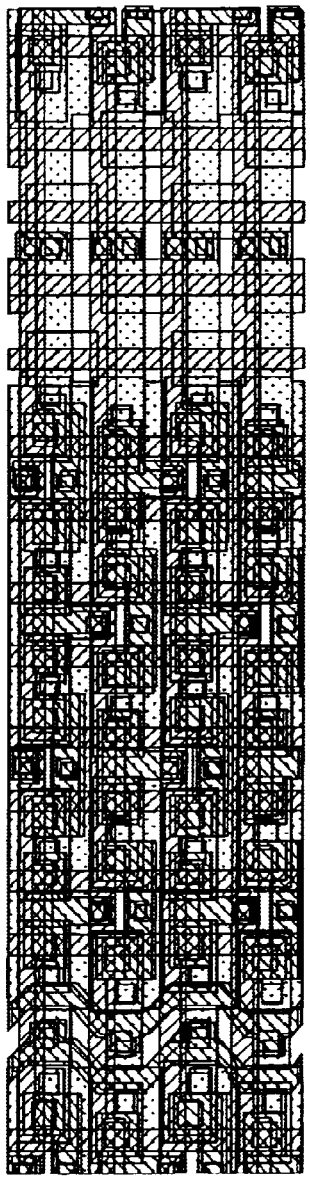
FIG. 10A is a plan view showing a layout of the whole ferroelectric memory according to a sixth embodiment of the present invention and FIG. 10B is a plan view showing a layout of a part of a ferroelectric memory according to the sixth embodiment of the present invention.
Figure 10B:
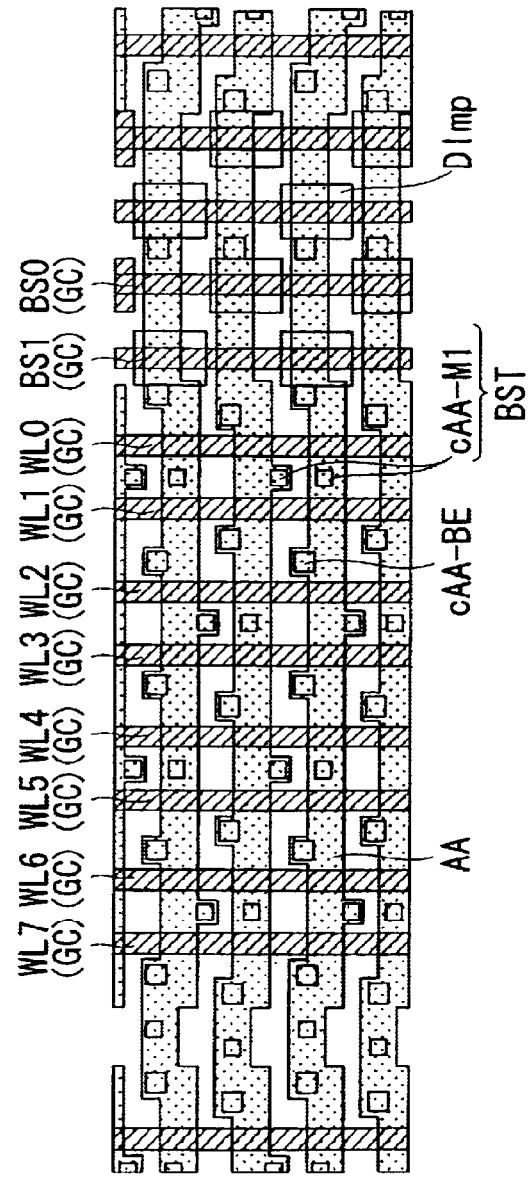

FIGS. 10A, 10B and FIGS. 11A, 11B show the sixth embodiment of the present invention. FIGS. 10A, 10B and FIGS. 11A, 11B show the whole configuration of a memory cell block using a memory cell of the type shown in FIG. 7A, the equivalent circuit of the memory cell block is similar to the equivalent circuit shown in FIG. 15A. FIG. 10A shows data of the whole layout of a cell block of the sixth embodiment. FIGS. 10B, 11A and 11B show a part of the layout within FIG. 10A by dividing the layout into the several layers, respectively.

In FIGS. 10B, 11A and 11B, like reference numerals are attached to like portions identical to those of FIGS. 8A, 8B and FIGS. 9A, 9B.

The sixth embodiment is different from the fifth embodiment in the following points. Specifically, in the sixth embodiment, one of the two kinds of block selection transistors BST consist of depression type transistors whose threshold voltage are negative.

FIG. 10B shows a D-type implantation mask (DImp) for forming a depression type transistor. By employing a depression type transistor, the area of a block selection transistor can be reduced, and the distance between the cell blocks adjacent to each other in the longitudinal direction can be reduced. Therefore, the higher integration can be carried out compared to the fifth embodiment.

Moreover, in FIG. 11A, every other cell block projects its end portion in the horizontal direction in the drawing. Therefore, the plate lines PL, /PL are not linearly arranged in the vertical direction in the drawing, but it may be arranged in a snaking shape.

The effect similar to that of the first embodiment can be also obtained according to the sixth embodiment.

(Seventh Embodiment)

Figure 12A:
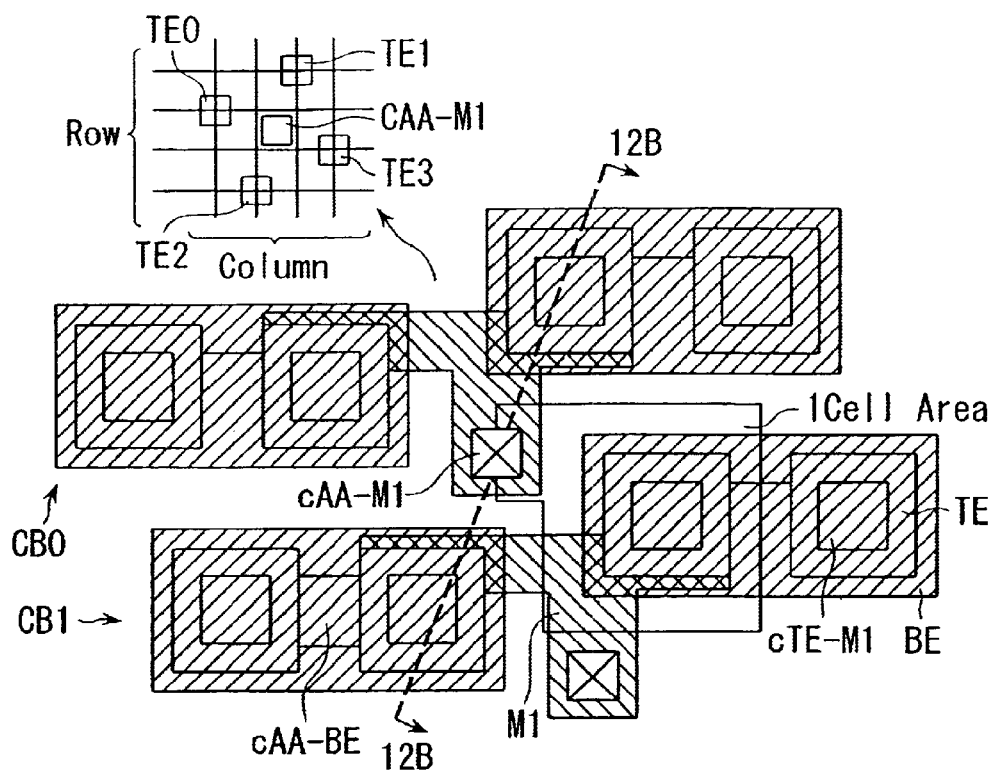
FIG. 12A is a plan view of a memory cell of a ferroelectric memory according to an eighth embodiment of the present invention and FIG. 12B is a sectional view taken along the line 12B—12B of FIG. 12A.
Figure 12B:
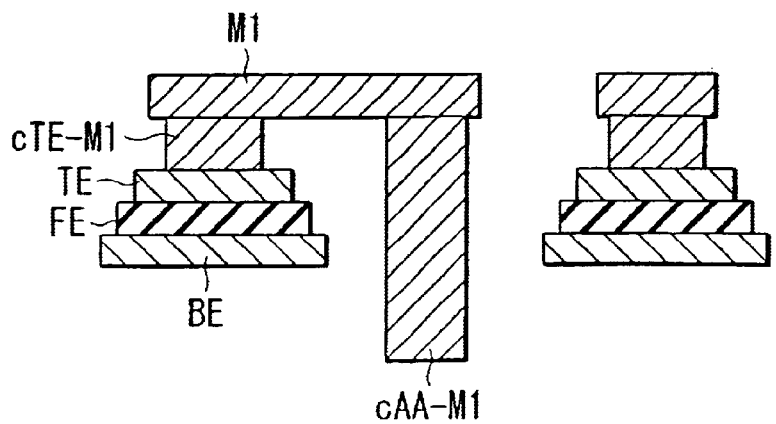

FIGS. 12A and 12B show the seventh embodiment of the present invention.

FIG. 12A can be applied to a configuration similar to the equivalent circuit shown in FIG. 15A, shows a plan view of a memory cell whose memory cell size can be reduced compared to those of FIGS. 16A to D, and FIG. 12B shows an example of a section taken along the line 12B—12B of FIG. 12A.

In FIGS. 12A and 12B, a ferroelectric film is denoted by FE, and a top electrode of a ferroelectric capacitor is denoted by TE. A bottom electrode of a ferroelectric capacitor is denoted by BE, and a metal wiring is denoted by M1. The contact cTE-M1 connects the top electrode TE and the metal wiring M1. The contact cAA-M1 connects between the metal wiring M1 and a source or drain electrode of a memory cell transistor. The contact cAA-BE connects between the bottom electrode BE and a source or drain electrode of a memory cell transistor. As a result, a cell transistor and a ferroelectric capacitor are connected in parallel, and one memory cell can be configured.

The ferroelectric capacitor is configured so that the top electrode TE and the bottom electrode BE sandwich the ferroelectric film FE. FIG. 12A shows an example of total eight ferroelectric capacitors. The bottom electrode BE of ferroelectric capacitor is shared with two adjacent ferroelectric capacitors. Therefore, in FIG. 12A, four bottom electrodes BE are arranged. In FIG. 12A, two bottom electrodes located on the upper right and upper left portions belong to the cell block CB0, and two bottom electrodes BE in the lower left and lower right portions belong to the cell block CB1.

The top electrodes TE of two ferroelectric capacitors in the cell block CB0 and the top electrodes TE of two ferroelectric capacitors in the cell block CB1 are connected to the first metal wiring M1 via the contact cTE-M1. The first metal wiring M1 is shared with two ferroelectric capacitors. Similarly, the contact cAA-M1 is also shared with two ferroelectric capacitors.

Now, in the configuration shown in FIG. 16D, the respective bottom electrodes BE which are shared with two ferroelectric capacitors are arranged at equal intervals, and the contact cAA-M1 is arranged at the center portion of two ferroelectric capacitors within the cell block. Therefore, the useless dead space has been produced.

On the other hand, in the seventh embodiment, each side of the contact cAA-M1 is made parallel with respect to the sides of each top electrode TE and bottom electrode BE. The four bottom electrodes BE located on the periphery of one contact cAA-M1 are offset with respect to each side of the contact cAA-M1 in the column and row directions, respectively. Therefore, as shown in FIG. 12A, the contact cAA-M1 is approximately arranged equally distanced from four top electrodes TE and the bottom electrodes BE. Specifically, for example, four top electrodes TE0 to TE3 located on the periphery of the contact cAA-M1 are arranged at the different column and row from each other. For example, the top electrode TE0 is arranged at (the second column, the first row), the top electrode TE1 is arranged at (the first column, the third row), the top electrode TE2 is arranged at (fourth column, the second row), the top electrode TE3 is arranged at (the third column, fourth row), respectively. Then, the contact cAA-M1 is arranged on the region enclosed by the second row, the third row, the second column and the third column. Therefore, the contact cAA-M1 is approximately set at center portion of four top electrodes TE0 to TE3, and approximately at intervals equally distanced from four top electrodes TE0 to TE3.

In this way, in the seventh embodiment, the positions of the top electrode TE and the bottom electrode BE are shifted so that the distance between the contact cAA-M1 and the top electrode TE and the distance between the contact cAA-M1 and the bottom electrode BE in the fixed distance are maintained and the distance between the contact cAA-M1 and the top electrode TE and the distance between the contact cAA-M1 and the bottom electrode BE are shortened. Therefore, the creation of the dead space can be prevented and the memory cell of which the increase of the cell size is suppressed can be realized.

As similar to the first embodiment, the corners of the top electrodes TE, the ferroelectric film FE and the bottom electrodes BE of four ferroelectric capacitors may be cut off, respectively. With such a configuration, a space is further created among four ferroelectric capacitors. Therefore, the distance between the contact cAA-M1 and the bottom electrodes BE, or the distance between the contact cAA-M1 and the top electrodes TE can be sufficiently maintained and the contact cAA-M1 can be arranged without increasing the size of a cell as well.

With such a configuration, the effect similar to that of the first embodiment can be also obtained according to the seventh embodiment.

(Eighth Embodiment)

Figure 13A:
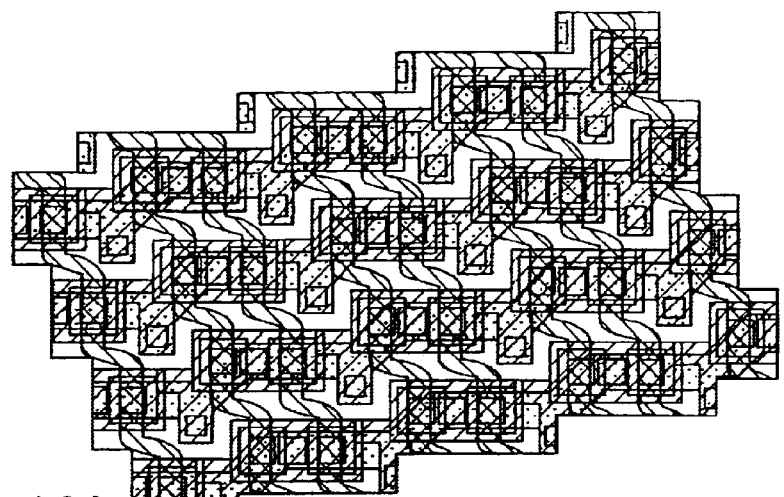
FIG. 13A is a plan view showing a layout of the whole ferroelectric memory according to a ninth embodiment of the present invention and FIG. 13B is a plan view showing a layout of FIG. 13A.
Figure 13B:
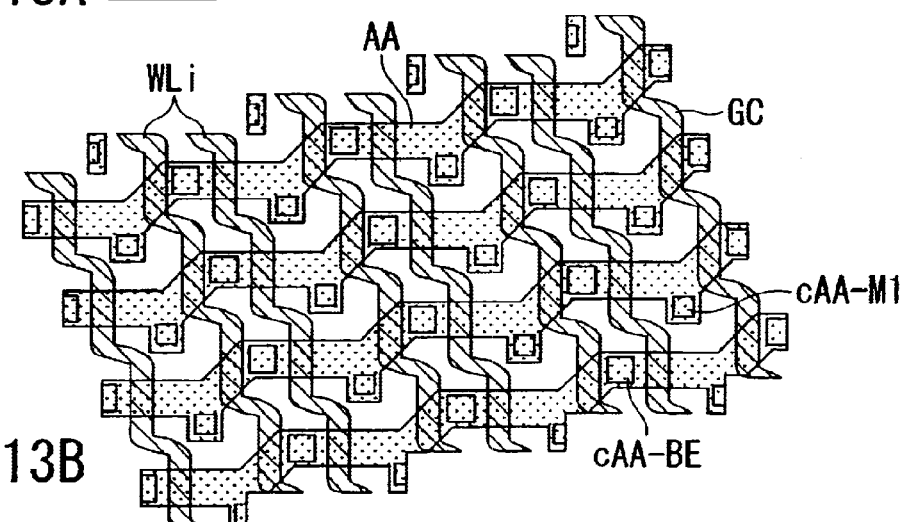
Figure 13C:
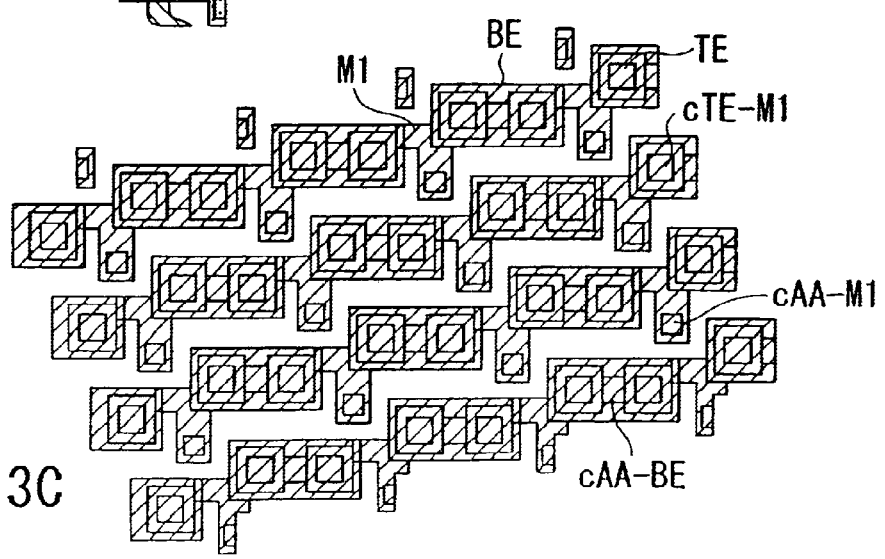
FIG. 13C is a plan view showing a layout of a part of FIG. 13A.
Figure 14C:
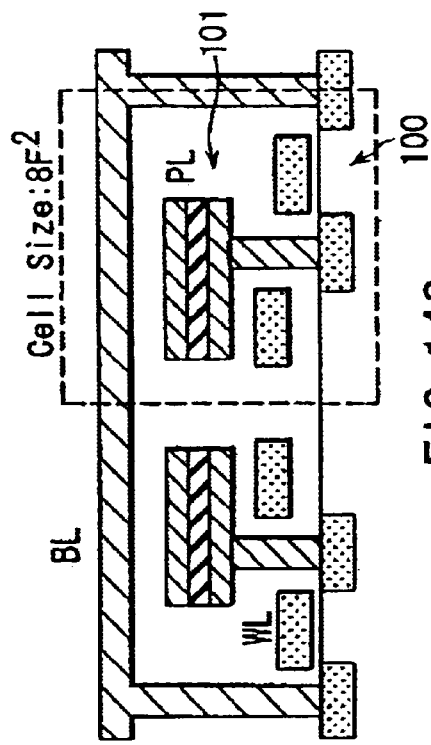
FIG. 14C is a sectional view showing a configuration of a conventional ferroelectric memory and FIG. 14D is a timing chart showing an operating timing of a conventional ferroelectric memory.
Figure 14D:
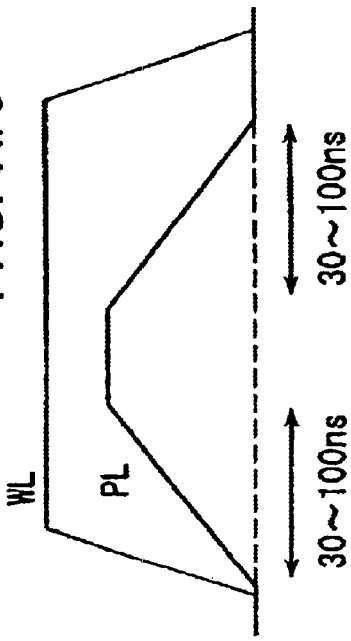
Figure 14A:
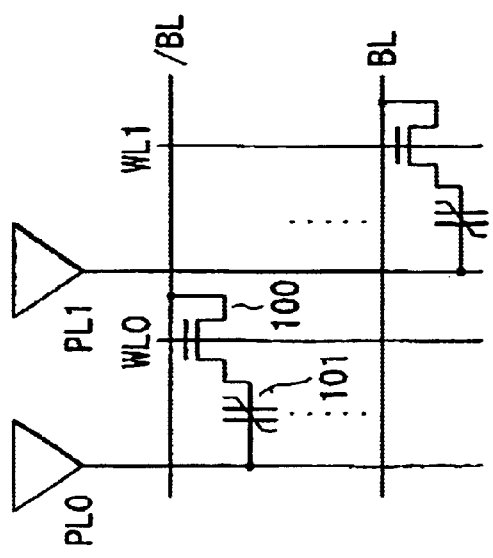
FIG. 14A is a circuit diagram showing a configuration of a conventional ferroelectric memory.
Figure 14B:
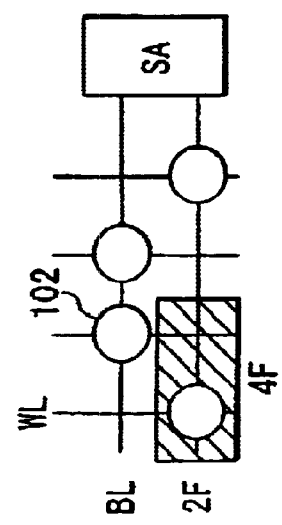
FIG. 14B is a conceptual diagram showing a configuration of a conventional ferroelectric memory.

FIGS. 13A, 13B and 13C show the eighth embodiment of the present invention. FIGS. 13A, 13B and 13C show the whole configuration of a memory cell block using a memory cell of the type shown in FIGS. 12A and 12B, the equivalent circuit of the memory cell block is similar to the equivalent circuit shown in FIG. 15A. FIG. 13A shows data of the whole layout of a cell block according to the eighth embodiment. FIGS. 13B and 13C show a part of the layout within FIG. 13A by dividing the layout into the several layers, respectively.

FIG. 13B shows a diffusion layer AA of a source and drain electrodes of a cell transistor, a contact cAA-M1 between the diffusion layer AA and the first metal wiring M1, a contact cAA-BE between a bottom electrodes BE of the ferroelectric capacitors and the diffusion layer AA, a gate layer GC of a transistor and a word line WLi. Within FIG. 13B, a plurality of cell blocks CB0 to CB3 are formed in a stepwise shape. Therefore, the word line WLi is not perpendicular to the array direction of the memory cell, but arranged in a crank-like shape.

FIG. 13C shows the first metal wiring M1, the top electrodes TE of the ferroelectric capacitors, the bottom electrodes BE of the ferroelectric capacitors, the contact cTE-M1 connecting the top electrodes TE of the ferroelectric capacitors and the first metal wirings W1, the contact cAA-BE connects the bottom electrodes BE of the ferroelectric capacitors and the diffusion layers and the contact cAA-M1 contacting the diffusion layer and the first metal wiring M1.

According to the eighth embodiment, similar to the seventh embodiment, the top electrodes TE and the bottom electrode BE are slightly shifted in the parallel, and in the vertical and horizontal directions so as to be arranged with respect to each side of the contact cAA-M1. Therefore, the contact cAA-M1 can be approximately arranged at positions equally distanced from four top electrodes TE and the bottom electrodes BE.

Furthermore, the creation of the dead space can be prevented and a memory cell of which the increase of the size of a cell is suppressed can be realized by maintaining the distance between the contact cAA-M1 and the top electrode TE and the distance between the contact cAA-M1 and the bottom electrode BE in the fixed distance and narrowing the distance between the contact cAA-M1 and the top electrode TE and the distance between the contact cAA-M1 and the bottom electrode BE.

The effect similar to that of the first embodiment can be also obtained according to the third embodiment. In the first to eighth embodiments, the shape of the top electrode TE and the bottom electrode BE may be a polygon having the number of sides equal to or more than that of a pentagon, or may be rounded as shown within the circle of FIG. 1A. In other words, the corner portions of the contact side of the top electrode TE and the bottom electrode BE may have an angle equal to or more than 90 degrees.

In the first to eighth embodiments, the contact cAA-M1 is connected to the top electrode TE via the metal wiring M1 and the contact cTM-M1. However, not limited to this, it is possible that the contact cAA-M1 is directly connected to the top electrode TE using, for example, dual damascene structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:

a first, second, third and fourth memory cells, an interval between said first and second memory cells being set in a first distance, an interval between said third and fourth memory cells being set in a second distance which is longer than said first distance, said first, second, third and fourth memory cells each having a cell transistor, a ferroelectric capacitor connected in parallel to said cell transistor, said ferroelectric capacitor having a bottom electrode, a top electrode and a ferroelectric film provided between said bottom and top electrodes, and said cell transistor having a source and drain terminals;

a first wiring having a first and second ends and a center portion positioned at the same direction from said first and second ends, said first end of said first wiring being connected to said top electrode of said ferroclectric capacitor of said first memory cell, said second end of said first wiring being connected to said top electrode of said ferroelectric capacitor of said second memory cell;

a first contact provided between said bottom electrode of said ferroelectric capacitor and one side of said source and drain terminals of said cell transistor;

a second contact provided between said center portion of said first wiring and another side of said source and drain terminals of said cell transistor of said first and second memory cells connected in series, said second contact being arranged in the perpendicular direction with respect to the array direction of said first and second memory cells and at an interval between said third and fourth memory cells;

a second wiring having said third, fourth ends and a center portion positioned at the same direction from said first and second ends, said third end of said second wiring being connected to said top electrode of said ferroelectric capacitor of said third memory cell, said fourth end of said second wiring being connected to said top electrode of said ferroelectric capacitor of said fourth memory cell; and a third contact provided between said center portion of said second wiring and one of said source and drain terminals of said cell transistor of said third and fourth memory cells connected in series, and said third contact being arranged with said second contact at an interval between said third and fourth memory cells.

2. The device according to claim 1, wherein mask patterns of said second and third contacts are a square.

3. A semiconductor memory device comprising:

a plurality of memory cells, each memory cell having a cell transistor and a ferroelectric capacitor connected in parallel between a source and drain terminals of said cell transistor;

a memory cell block in which a plurality of said memory cells are connected in series, said ferroelectric capacitor having bottom electrodes, one of said bottom electrodes being shared with two adjacent ferroelectric capacitors, a distance between said bottom electrodes being set at said every two bottom electrodes and set longer than other a distance between bottom electrodes;

a memory cell array in which a plurality of said memory cell blocks are arranged;

a first contact provided between said bottom electrode of said ferroelectric capacitor and one side of source and drain terminals of said cell transistor; and a second contact connecting a wire connected to said top electrode and one another side of said source and drain terminals of said cell transistor.

4. The device according to claim 3, wherein two contacts are arranged in said portion set longer between said bottom electrodes.

5. The device according to claim 3, further comprising:

a transistor connected to one end of said memory cell block, said transistor connecting said memory cell block to a bit line.

6. The device according to claim 3, wherein said selection gate is configured by two kinds of transistors, a threshold voltage of one of said transistors is positive, and a threshold voltage of another transistors is negative.

* * * * *